United States Patent [19]

Kessler et al.

[11] 4,161,702
[45] Jul. 17, 1979

[54] DISTRIBUTED FEEDBACK FILTER AND LASER

[75] Inventors: Bernard V. Kessler, Greenbelt; Gerald F. Hoff, Ashton; James R. Burke, Adelphia, all of Md.

[73] Assignee: The United States of America as represented by the Secretary of the Navy, Washington, D.C.

[21] Appl. No.: 838,778

[22] Filed: Sep. 28, 1977

[51] Int. Cl.² ............................................. H01S 3/19
[52] U.S. Cl. ............................... 331/94.5 H; 357/18
[58] Field of Search ................... 331/94.5 H; 357/17, 357/18

[56] References Cited

U.S. PATENT DOCUMENTS

| | | | |
|---|---|---|---|
| 3,983,509 | 9/1976 | Scifres et al. | 331/94.5 H |
| 4,023,118 | 5/1977 | Kessler et al. | 331/94.5 H |
| 4,081,763 | 3/1978 | Vlasenko et al. | 331/94.5 H |

OTHER PUBLICATIONS

Flicker et al., "Increased Tuning Range of $Pb_{1-x}Sn_xSe$ Diode Lasers Using Small Magnetic Fields", IEEE J. of Quantum Electronics, vol. QE-12, No. 6, Jun. 1976, pp. 326–330.

*Primary Examiner*—James W. Davie
*Attorney, Agent, or Firm*—R. S. Sciascia; A. L. Branning; R. E. Bushnell

[57] ABSTRACT

A distributed feedback optical device using a single crystal boule prepared with periodic spatial striations of ternary $Pb_{1-x}Sn_xTe$ and Yb impurity atoms forming a layered array of planar p-n junctions normal to the axis of light emission. Crystal surfaces parallel to the axis are coated with a reflective, electrical insulator. Free scattering losses are minimized by applying a magnetic field along the longitudinal axis.

11 Claims, 2 Drawing Figures

DISTRIBUTED FEEDBACK FILTER AND LASER

BACKGROUND OF THE INVENTION

The present invention pertains generally to semiconductor lasers and more particularly to distributed feedback lasers.

The first semiconductor laser operated only at cyrogenic temperatures. Lasing action occurred in a planar p-n junction created in a gallium-arsenide crystal. Although the single p-n junction was not, strictly speaking, an optical waveguide, there was gain in the plane of the junction and high absorption losses outside of the junction so that the light beam emerged in the plane of the junction. Recently, room temperature semiconductor lasers have been fabricated using a double heterojunction structure with a higher index of refraction material, such as gallium-arsenide, surrounded by a lower index of refraction material, such as gallium-aluminum-arsenide. Optical gain occurs in the center of the gallium-arsenide layer, providing room temperature operation with good optical confinement.

A double heterojunction laser dedicated at room temperature operation must be grown by tedious deposition of several layers by liquid epitaxy. This method of fabrication, and the subsequent attachment of leads, causes strains and micro-cracks that form regions of high absorption and ultimately, limits the lifetime of the device to a few thousand hours. Expensive and delicate techniques are required to avoid creation of these flaws. The output power is limited since lasing occurs only in the small volume of the single p-n junction. The beam emitted is geometrically poor, being planar, fan shaped; and the beam divergence is poor due to the diffraction caused at the single, narrow emitting junction.

For the benefit of those not familiar with advances made in this art over the past decade, the ensuing brief bibliography is included.

I. Hayashi, M. B. Panish, P. W. Foy and S. Sumsji, Appl. Phys. Letters 17, 109 (1970).

K. Morizane, A. Witt, H. C. Gatos, J. Electro. Soc. 114, 738 (1967).

K. Morizane, A. Witt, H. C. Gatos, J. Electro, Soc. 113, 51 (1966).

K. M. Kim, A. F. Witt and H. C. Gatos, J. Electro, Soc. 119, 1218 (1972) and A. F. Witt and H. C. Gatos, J. Electro, Soc. 113, 808 (1966).

H. Kogelnik and C. V. Shank, Appl. Phys. Letter 18, 152 (1971)

C. V. Shank, J. E. Bjorkholm and H. Kogelnik, Appl. Phys. Letters 18, 359 (1971).

H. Kogelnik and C. V. Shank, J. Appl. Phys. 43, 2327 (1972).

Schenke, Smith, Spencer, and Galvin, Appl. Phys. Letters 21, 494 (1972).

Nakamura, Yen, Yariv, Garmire, and Somekh, Appl. Phys. Letters 23, 224 (1973).

Bjorkholm, Sosnowski and Shank, Appl. Phys. Letters 4, 132 (1973).

Shank and Schmidt, Appl. Phys. Letters 213, 154 (1973).

Chen, LaMachia, Fraser, Appl. Phys. Letters 13, 223 (1968).

C. G. Burchkhardt, JOSA, 57, 601 (1967).

J. R. Burke, J. D. Jensen and B. B. Houston, J. Electro. Soc. 120, 431 (1973).

G. F. Hoff and J. D. Jensen, J. Appl. Phys. 45, 3883 (1974).

By the term "light," as used herein, is meant electromagnetic radiation not only in the visible spectrum but also in the infra-red and ultra-violet regions of the electromagnetic spectrum. The noun "semiconductor" is used to indicate an electronically conducting medium with a resistivity in the range between those of metals and insulators, and in which the conduction is by electrons, and holes.

SUMMARY OF THE INVENTION

In a patent issued to Bernard V. Kessler and Gerald F. Hoff, U.S. Pat. No. 4,023,118, there is disclosed a superheterojunction laser constructed from a cylindrical boule grown according to a novel Czochralski technique in which a multiple number of planar p-n junctions are formed from striations created in the boule as it is pulled at a constant rate from a melt to which an ultrasonic signal is applied. Impurity ions, such as ytterbium, dope a normally p-type semiconductor material, such as lead-telluride, and form active n-type conductivity layers interspersed at regular intervals as short as ten microns, between the remaining p-type material. Partial mirrors extend along the entire length of the boule. Application of a voltage across opposite bases of the boule with sufficient amplitude to force the back-biased junctions into a Zener mode allows an injection current to flow through the entire superheterojunction structure, causing laser action supported by the forward biased of the junctions. Gain in the plane of the junctions results in emission of a series of laser beams in those planes.

In the present invention, a semiconductor crystal boule such as the striated, large junction device of the type prepared according to the teachings of the U.S. Pat. No. 4,023,118, is mirrored on its cylindrical surfaces (i.e., those of its exterior surfaces generally parallel to the longitudinal axis of the crystal) with a totally reflective and preferably, electrically insulating, coating. Upon application of a signal greater in amplitude than a net Zener voltage across opposite bases of the crystal, backward Bragg diffraction through the periodic structure causes emission of light along the low gain, longitudinal axis. Subjection of the crystal to a uniform, constant, magnetic field along its longitudinal axis reduces the probability of transitions between energy levels, thereby lowering the amount of absorption and minimizing the free carrier scattering losses.

Accordingly, it is an object of the present invention to provide an improved semiconductor laser.

It is another object to provide a semiconductor laser emitting a high power beam.

It is also an object to provide an easily and inexpensively fabricated semiconductor laser having a long lifetime.

It is also another object to provide a semiconductor laser having a periodic structure distributed throughout its volume.

It is still another object to provide a multiple p-n junction semiconductor laser emitting a coherent beam along an axis normal to the planes of the junctions.

It is yet another object to provide a heterojunction semiconductor laser using distributed feedback throughout a crystal to achieve emission along the low-gain axis of the crystal.

It is still yet another object to provide a semiconductor laser exhibiting lower free scattering losses while using distributed feedback throughout a crystal to achieve emission along the low-gain axis of the crystal.

It is a further object to provide a semiconductor optical filter.

BRIEF DESCRIPTION OF THE DRAWINGS

A more complete appreciation of this invention, and many of the attendant advantages thereof, will be readily appreciated as the same becomes better understood by reference to the details of the following description when considered in conjunction with the accompanying drawings in which like numbers indicate the same or similar components, wherein.

DETAILED DESCRIPTION OF THE PREFERRED EMBODIMENT

Figure 1:
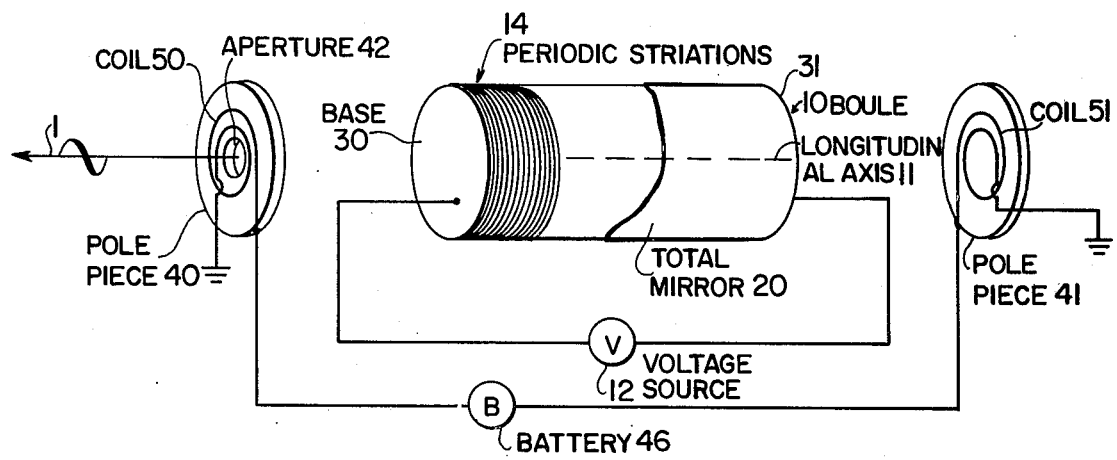
FIG. 1 illustrates a perspective view of the semiconductor boule of the present invention.
Figure 2:
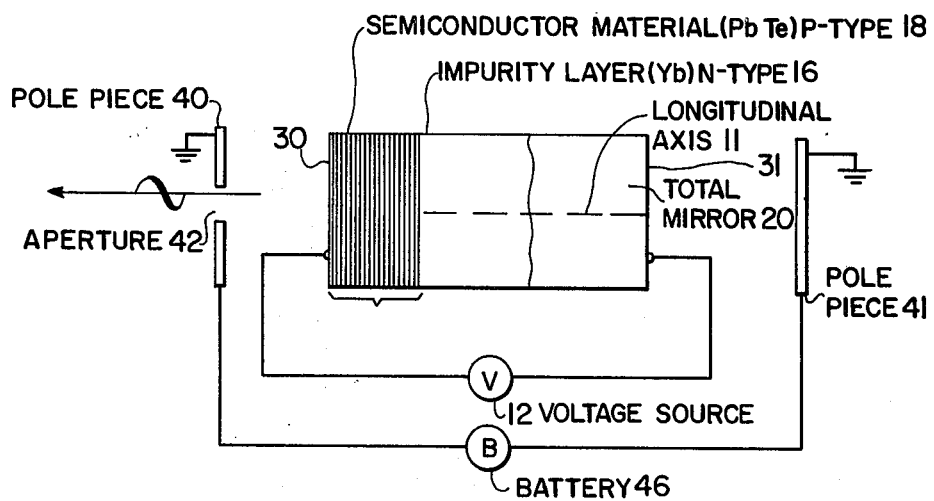
FIG. 2 illustrates a side view of the semiconductor boule.

FIG. 1 discloses a perspective view of a semiconductor boule 10 forming the device of the preferred embodiment. The boule 10 contains a series of periodic striations 14 which are formed in planes perpendicular to the axis 11 of the boule. The striae 14 are formed all along the length of the boule as schematically shown in both FIG. 1 and FIG. 2 and completely through the width of material so as to form a series of laminae, on planes arranged in stacked layers. The striations 14 in the present device constitute variations in the PbTe/Yb ratio along the growth axis, (i.e., the axis 11 of the boule 10). These stacked layers of striations are grown to form a series of p-n junctions by using the Czochralski technique.

As grown, PbTe forms a p-type semiconductor whereas PbTe+ 1% Yb ($Pb_{.99}Yb_{.01}Te$) forms an n-type semiconductor. By growing the boule 10 according to the Czochralski technique, the striations are formed containing the impurity atom, Yb(n-type) while the region between the striation contains PbTe(n-type). The variation in the distance between the striations is controlled by the rate that the crystal is pulled from the melt as well as the frequency of sumperimposed ultrasonic oscillations in the melt. Striations formed by ultrasonic oscillations have been found to be extremely regular with spacings as short as ten microns. A one centimeter boule could therefore contain as many as a thousand p-n junctions, and a ten centimeter boule would contain 10,000 p-n junctions.

The creation of striae 14 by pulling boule 10 in the presence of an ultrasonic field during growth means that adjoining layers differ not only in type of conductivity, but also in composition and therefore, in indices of refraction. The slight variation of the indicies of refraction along an axis running through boule 10 in any direction except perpendicular to longitudinal axis 11, defines a regular, periodic structure. The ultrasonic wavelength during crystal growth is chosen as:

$$\Omega = (\lambda/2n) \quad (1)$$

where:
  $\lambda$ is the characteristic wavelength of the semiconductor material; and,
  n is the effective refractive index of light in the host semiconductor material.

A host semiconductor material such as $Pb_{0.8}Sn_{0.2}Te$ has an effective refractive index, n, of approximately six. For a optical device prepared from that material and emitting light with a wavelength of ten microns then, the wavelength, $\Omega$, of the ultrasonic signal applied during growth of boule 10 is approximately $10^{-4}$ centimeters.

Application of a voltage to the series of junctions by voltage source 12 would not normally cause the p-n junctions to lase since every other junction is back-biased, thus preventing an injection current from flowing. Application of a higher voltage however, forces the back-biased junctions to "break-down" into a Zener mode to allow the injection current to flow through the entire crystal structure, resulting in laser action supported by the forward biased junctions. In the device disclosed in the U.S. Pat. No. 4,023,118, partial mirrors extended along the entire length of the crystal boule. Since there is gain in the planes of the junctions (i.e., planes perpendicular to the longitudinal axis of the boule) that device will emit a series of laser beams in those planes. The present invention however, has its cylindrical surfaces (i.e., those exterior surfaces of the boule 10 approximately parallel to longitudinal axis 11) mirrored with a totally reflecting and preferably, electrically insulating coating to suppress light emission along the low-threshold planes of the junctions. The periodic variation of the indices of refraction, a variation the order of approximately one percent of the effective index of refraction in the host semiconductor material, define a periodic structure that causes backward Bragg diffraction. It is the uniform distribution of the periodic structure throughout the volume of boule 10 (i.e., a "volume" Bragg structure) and thus, the uniform distribution of diffracted light, that allows the device to be described as a "distributed feedback laser." Such a crystal exhibits laser action along the longitudinal axis 11 of the cylindrical crystal 10, in a direction perpendicular to the planes of the junctions.

A distributed feedback laser emitting light 1 along a longitudinal axis 11 perpendicular to the planes of the junctions has a higher threshold than a laser emitting light in the plane of the junctions because the gain in the junction region with optical amplification must overcome the high losses in the alternating, highly attenuating, non-junction regions. One way to minimize these free carrier scattering losses is to apply an uniform magnetic field along the longitudinal axis 11, between opposite bases 30, 31 of the crystal 10. The field causes the continuous bonds to break into a set of Landau levels. Free carrier scattering is then reduced as there are far fewer electronic final energy states to scatter into; hence, photon-electron scattering is reduced. A pair of magnetic plates 40, 42, across which a voltage source 46 is coupled, placed adjacent, but electrically isolated from, and preferably coaxially aligned with, opposed bases 30, 31 of crystal 10, serve as pole pieces for the application of a uniform magnetic field along the longitudinal axis of crystal 10. The pole piece 40 adjacent the light emitting base 30 provides an aperture 42 for the passage of light beam 1.

There is also the possibility of constructing a tunable laser which has Landau levels as the uppper and lower transition states. The output beam 1 would be narrow, coherent, and well collimated. Such a distributed feedback semiconductor laser would have a beam width about equal to that of a ruby of neodymium glass laser as, $$\theta = 1.22(\lambda/d) \quad (2)$$

where d is the diameter of a large, circular coherent aperture of approximately two centimeters. Disc type structures may also be grown, an advantage in segmented laser technology where heat dissipation becomes important.

A primary advantage of the present device is its high mode purity. The boundary conditions, that is, the periodic variation of the index of refraction along the longitudinal axis of the crystal, limit the longitudinal modes of the light emitted. By way of analogy, if electrical noise is introduced into a sharply tuned feedback oscillator circuit, a sine wave appears across the output terminals of the circuit. Periodic structures also produce significantly better spectral purity, thereby achieving a single longitudinal and transverse oscillation mode.

Another advantage of the distributed feedback laser over conventionally prepared heterojunction lasers is its longer lifetime due to lack of strains produced in the semiconductor material. The semiconductor boule laser is pulled continuously from the melt without breaking vacuum, in the presence of a strong standing wave ultrasonic field aligned along the axis 11 of the boule. The junctions are therefore not subject to exposure to air or even an imperfect vacuum as occurs in the construction of a double heterojunction laser made of compound liquid epitaxy layers grown in time sequence in imperfect conditions producing such strains and limiting the laser's lifetime.

The present invention provides a periodic structure throughout the volume of the boule. An optic device incorporating this boule has greater junction area, and thus, is able to operate at a higher power than conventional devices. Additionally, the device exhibits higher mode purity and gives better geometry of the narrow beam emitted.

OPTICAL FILTER

Conventional Interference filters are multilayer dielectric stacks of thin layers with different refractive indicies. Present limits of conventional technology restrict interference filters to a stack of about seventy layers because each layer is put down in a separate evaporation step upon the previous layer and defects and various irregularities accumulate. Long range order is crucial. It is a costly and tedious process. It is sometimes desirable to have a sharper filter, (i.e., smaller bandwith) than can be provided by a seventy layer stack.

The structure generated by a crystal growth in an intense ultrasonic field makes an optical filter of very narrow bandwidth. Recall that the passband of a grating varies inversely with the total number of lines in the grating. In this application p-n junctions are not absolutely required. Only a periodic variation in the refractive index is needed and any suitable material can be so employed. One such crystal that can withstand large electrical fields such as sapphire ($Al_2O_3$) would be grown with the required periodic variation of refractive index at the desired wavelength. It could serve as a laser mirror. Because of the refractive index modulation, depth would be smaller (about 1%) than for a conventional multilayer stack (20% layer-to-layer variation), the longitudinal length of the mirror would be considerably longer for the n-modulated sapphire but this is of no particular disadvantage. In fact for high power work the field discontinuities would be less for a one thousand layer refractive-index modulated sapphire. Dielectric breakdown would be less probable and power handling capacity higher. Spatial discrimination against other longitudinal and transverse modes are provided and spectral purity improved.

The invention has been shown and described with reference to particular embodiments thereof in order to enable those skilled in the art to make and use the same. Various modifications are possible. For instance, although the crystal boules have been separately described as having a composition tuned optical absorption edge, and various ternary alloys of lead, tin, cadmium and mercury chalcogenides have been suggested suitable semiconductor materials, any semiconductor alloy, whether binary, ternary, or quaternary, may be viably used to prepare the striated distributed feedback crystal 10. Such semiconductor materials as gallium phosphide, gallium arsenide, zinc sulfide, zinc selenide, zinc telluride, cadmium sulfide, cadmium selenide, cadmium telluride, germanium, silicon, indium phosphide, indium arsenide, indium antimony phosphide, indium antimony arsenide, indium gallium arsenide phosphide, lead sulfide, lead selenide, lead telluride, a lead cadmium chalcogenide, a lead tin chalcogenide, or a mercury cadmium chalcogenide may be used to prepare the crystal.

Obviously many modifications and variations of the present invention are possible in light of the above teachings. For example, other semiconductors such as InSb doped with Te as an impurity can also be grown with striations. The Te precipitates out (i.e., segregates) and forms the periodic striations. In addition, any suitable configuration of mirrors could be used to form the desired beam geometry. Also, the boule can take any form necessary for any desired application. It is therefore to be understood that with the scope of the appended claims the invention may be practiced otherwise than as specifically described.

What is claimed as new and desired to be secured by Letters Patent of the United States is:

1. An optical device, comprised of:
   a boule with a pair of opposed bases normal to a longitudinal axis, prepared from a first semiconductor material having a first type conductivity and an impurity for rendering the first material a second and opposite type conductivity;
   a plurality of layers alternately of the first and the second type conductivity defining junction planes normal to the axis;
   a reflective coating on all cylindrical surfaces of the boule between the bases;
   voltage means of sufficient amplitude to cause an injection current to flow through the boule, coupled across the bases; and,
   field means for applying a uniform magnetic field along the axis between the bases.

2. The optical device set forth in claim 1, further comprised of:
   the junction planes completely dividing the boule.

3. The optical device set forth in claim 1, further comprised of:
   the plurality of layers being periodically striated layers of impurity ions formed in the boule in densities sufficient to create the junctions between each of the layers by the application of a standing wave ultrasonic field of predetermined frequency aligned along the direction of movement while the boule is pulled at a predetermined rate from a melt containing ions of the impurity.

4. The device set forth in claim 3, further comprised of the striae having a spacing equal to or greater than ten microns.

5. An optical device, comprised of:
a first plurality of layers of a first semiconductor material;
a second plurality of layers of a second semiconductor material differing in composition from the first semiconductor material;
the first and second semiconductor materials having different indices of refraction;
the second plurality of layers being interleaved with the first plurality of layers such that alternate layers of the device have different indicies of refraction;
each of the plurality of interleaved layers having thickness, t, according to the relationship $t = m\lambda/2n$ where m is an integer equal to the mode of the laser oscillations, $\lambda$ is the wavelength of the light photons generated in the first plurality of layers when the first plurality of layers is electrically pumped, and n is the refractive index of the material of each layer;
a rectifying junction extending between each adjoining pair of the layers;
a near totally reflective coating on all surfaces formed by the perimeters of the layers; and,
means connected across the volume between the perimeters of the layers for electrically pumping the first plurality of layers to produce the light photons whereby the photons are coupled and reinforced in phase by the second plurality of layers to provide a coherent beam of light.

6. The device set forth in claim 5, further comprised of:
the first plurality of layers having a first type conductivity;
the second plurality of layers having a second and opposite type conductivity; and
the second plurality of layers differing in composition from the first plurality of layers only by the presence of impurity ions.

7. The device set forth in claim 5, further comprising:
means for maintaining a uniform magnetic field about the device along an axis normal to each rectifying junction.

8. A semiconductor device, comprising:
a first plurality of layers of a first semiconductor material having a first a type conductivity and a first index of refraction;
a second plurality of layers of a second semiconductor material having a second and opposite type conductivity and a second and different index of refraction;
a cylindrical crystal formed with the first plurality of layers interleaved with the second plurality of layers along a longitudinal axis of the crystal;
adjoining layers forming planar junctions completely dividing the crystal;
a reflective coating covering the cylindrical surfaces of the crystal;
means for applying an uniform magnetic field along the longitudinal axis; and
a source of voltage with sufficient amplitude to cause an injection current to flow through the crystal, coupled across the crystal at opposite extremities of the longitudinal axis.

9. The device set forth in claim 8, further comprising:
the first and second pluralities of layers differing in composition only by the presence of impurity ions in one of the pluralities of layers.

10. A method of producing a laser beam, comprising the steps of:
applying a uniform magnetic field along a longitudinal axis of a cylindrically shaped superheterojunction crystal having a reflective coating covering all cylindrical surfaces; and
coupling across opposite extremeties of the axis source of voltage with sufficient amplitude to cause an injection current to flow through the crystal.

11. The method set forth in claim 10, further comprising:
forming the superheterojunction crystal for a semiconductor material by pulling the material from a melt containing impurity ions, at a fixed rate in the presence of an ultrasonic signal aligned along the longitudinal axis.

* * * * *